US009437835B2

(12) United States Patent
So et al.

(10) Patent No.: US 9,437,835 B2
(45) Date of Patent: Sep. 6, 2016

(54) TRANSPARENT INFRARED-TO-VISIBLE UP-CONVERSION DEVICE

(75) Inventors: Franky So, Gainesville, FL (US); Do Young Kim, Gainesville, FL (US); Bhabendra K. Pradhan, Marietta, GA (US)

(73) Assignees: University of Florida Research Foundation, Inc., Gainesville, FL (US); Nanoholdings, LLC, Rowayton, CT (US)

( * ) Notice: Subject to any disclaimer, the term of this patent is extended or adjusted under 35 U.S.C. 154(b) by 0 days.

(21) Appl. No.: 14/124,158

(22) PCT Filed: Jun. 6, 2012

(86) PCT No.: PCT/US2012/040981
§ 371 (c)(1),
(2), (4) Date: Feb. 10, 2014

(87) PCT Pub. No.: WO2012/170457
PCT Pub. Date: Dec. 13, 2012

(65) Prior Publication Data
US 2014/0175410 A1 Jun. 26, 2014

Related U.S. Application Data

(60) Provisional application No. 61/493,696, filed on Jun. 6, 2011.

(51) Int. Cl.
*H01L 29/08* (2006.01)
*H01L 35/24* (2006.01)
(Continued)

(52) U.S. Cl.
CPC ............. *H01L 51/52* (2013.01); *H01L 27/288* (2013.01); *H01L 31/02322* (2013.01);
(Continued)

(58) Field of Classification Search
CPC . H01L 27/288; H01L 51/0083; H01L 51/52; H01L 31/055; H01L 31/02322; H01L 51/5088; H01L 51/5056; H01L 51/5096; H01L 51/4253; H01L 51/426; H01L 51/442; H01L 51/00; H01L 51/50
See application file for complete search history.

(56) References Cited

U.S. PATENT DOCUMENTS

| 4,885,211 A | 12/1989 | Tang et al. |
| 2004/0016923 A1* | 1/2004 | Yu et al. .................... 257/49 |

(Continued)

FOREIGN PATENT DOCUMENTS

| CN | 1498049 A | 5/2004 |
| CN | 1773732 A | 5/2006 |

(Continued)

OTHER PUBLICATIONS

International Search Report and Written Opinion dated Dec. 26, 2012 in connection with Application No. PCT/US2012/040981.
(Continued)

*Primary Examiner* — Charles Garber
*Assistant Examiner* — Abdulfattah Mustapha
(74) *Attorney, Agent, or Firm* — Wolf, Greenfield & Sacks, P.C.

(57) ABSTRACT

Embodiments of the invention are directed to a transparent up-conversion device having two transparent electrodes. In embodiments of the invention, the up-conversion device comprises a stack of layers proceeding from a transparent substrate including an anode, a hole blocking layer, an IR sensitizing layer, a hole transport layer, a light emitting layer, an electron transport layer, a cathode, and an antireflective layer. In an embodiment of the invention, the up-conversion device includes an IR pass visible blocking layer.

19 Claims, 6 Drawing Sheets

(51) Int. Cl.

| | | |
|---|---|---|
| H01L 51/00 | (2006.01) | |
| H01L 51/52 | (2006.01) | |
| H01L 27/28 | (2006.01) | |
| H01L 31/0232 | (2014.01) | |
| H01L 31/055 | (2014.01) | |
| H01L 51/50 | (2006.01) | |
| H01L 51/42 | (2006.01) | |
| H01L 51/44 | (2006.01) | |

(52) U.S. Cl.
CPC ........ *H01L 31/055* (2013.01); *H01L 51/0083* (2013.01); *H01L 51/426* (2013.01); *H01L 51/4253* (2013.01); *H01L 51/442* (2013.01); *H01L 51/5056* (2013.01); *H01L 51/5088* (2013.01); *H01L 51/5096* (2013.01); *Y02E 10/52* (2013.01)

(56) References Cited

U.S. PATENT DOCUMENTS

| | | | |
|---|---|---|---|
| 2006/0032528 A1* | 2/2006 | Wang | 136/263 |
| 2007/0216985 A1* | 9/2007 | Woodall et al. | 359/237 |
| 2008/0258615 A1* | 10/2008 | Begley et al. | 313/504 |
| 2012/0187295 A1* | 7/2012 | So | H01L 31/02322 250/340 |

FOREIGN PATENT DOCUMENTS

| | | |
|---|---|---|
| CN | 101421664 A | 4/2009 |
| WO | WO 2011/066396 A2 | 6/2011 |

OTHER PUBLICATIONS

International Preliminary Report on Patentability dated Dec. 27, 2013 in connection with Application No. PCT/US2012/040981.

Guo et al., A novel approach to all-optical wavelength conversion by utilizing a reflective semiconductor optical amplifier in a co-propagation scheme. Optics Communications. Sep. 2008;281(17):4470-4473.

Kim et al., Organic infrared upconversion device. Adv Mater. May 25, 2010;22(20):2260-3. doi: 10.1002/adma 200903312.

Kim et al., PbSe nanocrystal-based infrared-to-visible up-conversion device. Nano Lett. May 11, 2011;11(5):2109-13. doi: 10.1021/n1200704h. Epub Apr. 19, 2011.

Wang et al., Correlation between mechanical stress and optical properties of $SiO_2/Ta_2O_5$ multilayer UV narrow-bandpass filters deposited by plasma ion-assisted deposition, Proc of SPIE. 2005;58700E: 1-9. doi: 10.1117/12.613285.

Chinese Office Action and English translation dated Jun. 3, 2015 in connection with Application No. 201280027199.6.

Extended European Search Report dated Apr. 14, 2015 in connection with Application No. 12797397.2.

Chen et al., Near-infrared optical upconverter based on i-$In_{0.53}Ga_{0.47}As/C_{60}$ photovoltaic heterojunction. Electronics Letters. 2009;45(14):753-5.

* cited by examiner

TRANSPARENT INFRARED-TO-VISIBLE UP-CONVERSION DEVICE

RELATED APPLICATIONS

The present application is a U.S. national stage filing under 35 U.S.C. §371 based on International Application No. PCT/US2012/040981, filed Jun. 6, 2012, which claims the benefit of U.S. Provisional Application Ser. No. 61/493,696, filed Jun. 6, 2011, both of which are hereby incorporated by reference herein in their entireties, including any figures, tables, or drawings.

BACKGROUND OF INVENTION

Recently, light up-conversion devices have attracted a great deal of research interest because of their potential applications in night vision, range finding, and security, as well as semiconductor wafer inspections. Early near infrared (NIR) up-conversion devices were mostly based on the heterojunction structure of inorganic semiconductors, where a photodetecting and a luminescent section are in series. Fabrication of infrared IR-to-visible up-conversion devices based on inorganic compound semiconductors is challenging because of the lattice mismatch between the two types of semiconductor materials used for photodetectors and light-emitting diodes LEDs. Because of the high cost of epitaxial grown inorganic devices, inorganic devices have been restricted to fabrication of small area applications.

Other up-conversion devices tend to display efficiencies that are typically very low. For example, a NIR-to-visible light up-conversion device that integrates a LED with a semiconductor based photodetector has exhibited a maximum external conversion efficiency of only 0.048 (4.8%) W/W. More recently, a hybrid organic/inorganic up-conversion device, where an InGaAs/InP photodetector is coupled to an organic light-emitting diode (OLED), has displayed an external conversion efficiency of 0.7% W/W. Currently inorganic and hybrid up-conversion devices are expensive to fabricate and the processes used for fabricating these devices are not compatible with large area applications. Efforts are being made to achieve low cost up-conversion devices with high conversion efficiencies, high sensitivity, high gain, and high image fidelity. Additionally, a device where the IR irradiation enters from a one face and light exclusively exits from a second face is desirable for many applications such as night vision applications.

BRIEF SUMMARY

Embodiments of the invention are directed to transparent up-conversion devices that have a stacked layer structure. The layer include a transparent anode, at least one hole blocking layer, an IR sensitizing layer, at least one hole transport layer, a light emitting layer, at least one electron transport layer, and a transparent cathode. The stacked layer structure can be less than a micron in thickness. Anodes can be chosen from any appropriate conducting material including: indium tin oxide (ITO), indium zinc oxide (IZO), aluminum tin oxide (ATO), aluminum zinc oxide (AZO); carbon nanotubes; or silver nanowires. Hole blocking layers can be chosen from any appropriate material including: $TiO_2$; ZnO; BCP; Bphen; 3TPYMB; or UGH2. IR sensitizing layer can be any appropriate material including: PbSe QDs; PbS QDs; PbSe film; PbS film; InAs film; InGaAs film; Si film; Ge film; GaAs film; perylene-3,4,9,10-tetracarboxylic-3,4,9,10-dianhydride (PTCDA); tin (II) phthalocyanine (SnPc); SnPc:$C_{60}$; aluminum phthalocyanine chloride (AlPcCl); AlPcCl:$C_{60}$; titanyl phthalocyanine (TiOPc); or TiOPc:$C_{60}$. The hole transport layer can be any appropriate material including: 1,1-bis[(di-4-tolylamino)phenyl] cyclohexane (TAPC); N,N'-diphenyl-N,N'(2-naphthyl)-(1,1'-phenyl)-4,4'-diamine (NPB); and N,N'-diphenyl-N,N'-di (m-tolyl) benzidine (TPD). The light emitting layer can be any appropriate material including: tris-(2-phenylpyridine) iridium; Ir(ppy)$_3$; poly-[2-methoxy-5-(2'-ethyl-hexyloxy) phenylene vinylene] (MEH-PPV); tris-(8-hydroxy quinoline) aluminum (Alq$_3$); or iridium (III) bis-[(4,6-di-fluorophenyl)-pyridinate-N,C2']picolinate (FIrpic). The electron transport layer can be any appropriate material including: tris[3-(3-pyridyl)-mesityl]borane (3TPYMB); 2,9-Dimethyl-4,7-diphenyl-1,10-phenanthroline (BCP); 4,7-diphenyl-1,10-phenanthroline (BPhen); and tris-(8-hydroxy quinoline) aluminum (Alq$_3$). The cathode can be Indium Tin Oxide (ITO), Indium Zinc Oxide (IZO), Aluminum Tin Oxide (ATO), Aluminum Zinc Oxide (AZO), carbon nanotube, silver nanowire, an Mg:Al layer, or any appropriate transparent conductor.

In an embodiment of the invention, the up-conversion device further comprises an antireflective layer. In one embodiment the antireflective layer can be an Alq$_3$ layer having a thickness of less than 200 mm. In another embodiment of the invention, the up-conversion device further comprises an IR pass visible blocking layer. The IR pass visible blocking layer can comprise a plurality of alternating layers of materials having different refractive indexes, such as alternating layers of $Ta_2O_5$ and $SiO_2$.

DETAILED DISCLOSURE

Figure 1:
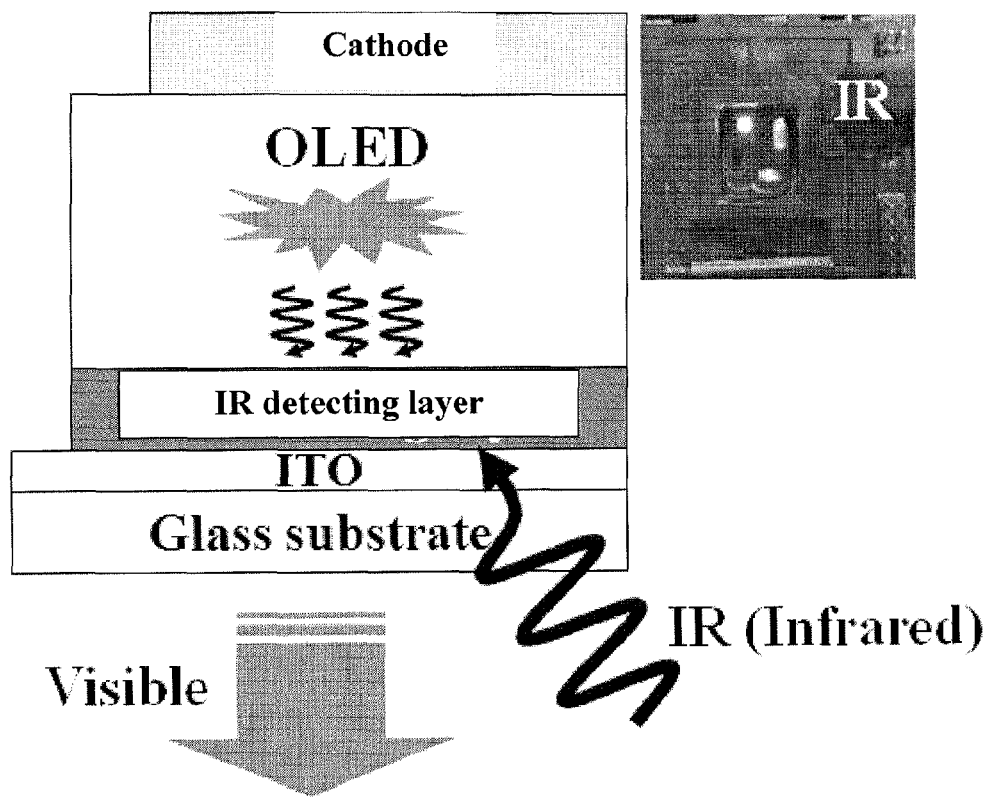
FIG. 1 is a schematic diagram of a reflective infrared (IR) up-conversion device.
Figure 2:
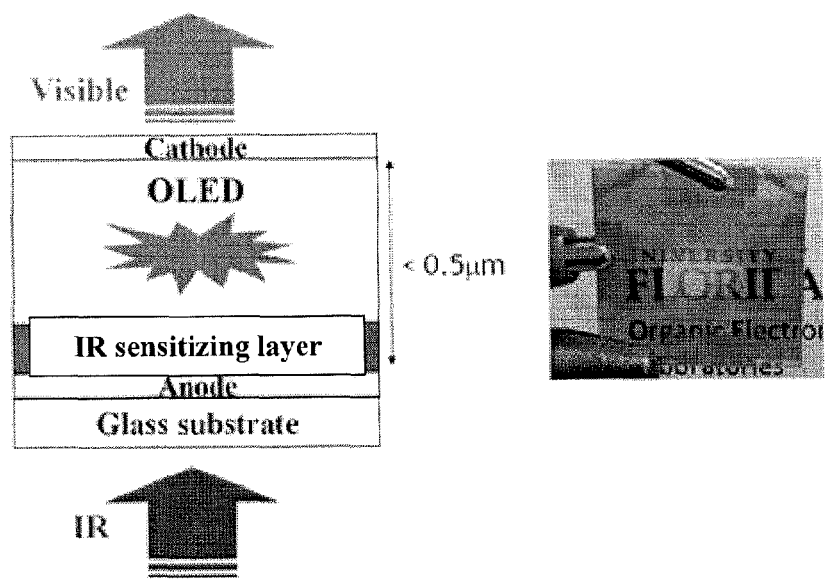
FIG. 2 is a schematic diagram of a transparent IR up-conversion device having a pair of transparent electrodes according to an embodiment of the invention.
Figure 3:
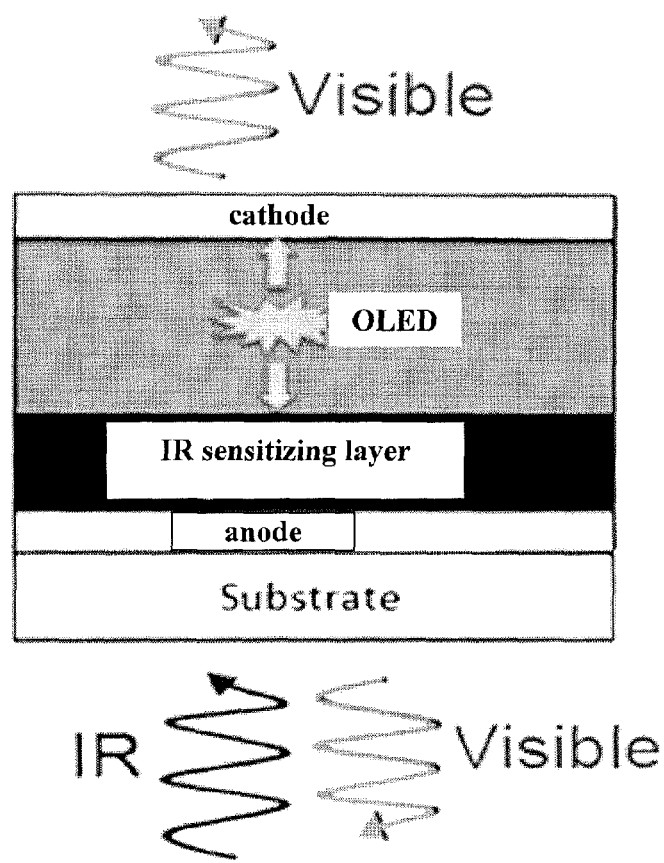
FIG. 3 is a schematic diagram of a transparent IR up-conversion device, according to an embodiment of the invention, where emitted visible light exits from two surfaces of the device.

Embodiments of the invention are directed to transparent IR-to-Visible up-conversion devices having two electrodes that are transparent to visible light, also indicated as visible or light herein. In an embodiment of the invention, the output of the visible light generated is restricted from radiating out of the surface where the IR radiation, also indicated as IR herein, enters, even though visible light can enter from the surface, or face, where the IR enters. A typical reflective up-conversion device is shown in FIG. 1, where the source IR enters and the generated visible light exits the IR entry surface. A transparent up-conversion device, according to an embodiment of the invention, is shown in FIG. 2, where an IR sensitive layer, situated on one side of an electrode, generates a charge carrier, either an electron or a hole, that under the bias of the device is directed to a light emitting layer where the carrier combines with its complementary charge carrier to generate visible light. As shown in FIG. 2, the up-conversion device is constructed with two transparent electrodes and the visible light, either that entering or that generated within the device, is transmitted through the opposite face of the IR entry surface of the device. However, as shown in FIG. 3, light generated by the light emitting layer radiates in all directions from the light emitting layer, including the IR entry face of the device. To achieve high transparency the entire up conversion device is thin, comprising a series of layers, where the combined layers, with the exception of the substrate that supports the device and any IR pass visible blocking layer, has a thicknesses of less than about a micron, for example less than 0.5 microns in thickness. The supporting substrate can be, for example, a glass or a polymeric material that is highly transmissive of IR and visible light, and a second substrate can be used on the face opposing the first supporting substrate of the IR up-conversion device.

In embodiments of the invention, the IR sensitizing layer can be a broad absorption IR sensitizing layer comprising mixed PbSe QDs or mixed PbS QDs. In other embodiments of the invention, the IR sensitizing layer comprises a continuous thin film of: PbSe, PbS, InAs, InGaAs, Si, Ge, or GaAs. In other embodiments of the invention, the IR sensitizing layer is an organic or organometallic comprising material, such as, but not limited to: perylene-3,4,9,10-tetracarboxylic-3,4,9,10-dianhydride (PTCDA), tin (II) phthalocyanine (SnPc), SnPc:$C_{60}$, aluminum phthalocyanine chloride (AlPcCl), AlPcCl:$C_{60}$, titanyl phthalocyanine (TiOPc), and TiOPc:$C_{60}$.

In an embodiment of the invention, the light emitting layer is an organic light emitting layer comprising fac-tris (2-phenylpyridine)iridium (Ir(ppy)$_3$), which emits green light at 515 nm. Other light emitting materials that can be employed in embodiments of the invention include, but are not limited to: poly-[2-methoxy, 5-(2'-ethyl-hexyloxy) phenylene vinylene] (MEH-PPV), tris-(8-hydroxy quinoline) aluminum (Alq$_3$), and iridium (III) bis-[(4,6-di-fluorophenyl)-pyridinate-N,C2']picolinate (FIrpic).

In embodiments of the invention, an electron transport layer (ETL) is situated between the light emitting layer and the cathode. The ETL comprises tris[3-(3-pyridyl)-mesityl] borane (3TPYMB), 2,9-Dimethyl-4,7-diphenyl-1,10-phenanthroline (BCP), 4,7-diphenyl-1,10-phenanthroline (BPhen), tris-(8-hydroxy quinoline) aluminum (Alq$_3$), or any other appropriate material.

In embodiments of the invention, a hole transport layer (HTL), which is situated between the light emitting layer and IR sensitizing layer, comprises 1,1-bis[(di-4-tolylamino)phenyl]cyclohexane (TAPC), N,N'-diphenyl-N,N' (2-naphthyl)-(1,1'-phenyl)-4,4'-diamine (NPB), N,N'-diphenyl-N,N'-di(m-tolyl) benzidine (TPD), or any other appropriate material.

In embodiments of the invention, a hole blocking layer (HBL) resides between the anode and the IR sensitizing layer. The HBL can be an inorganic HBL comprising ZnO, TiO$_2$, or any other appropriate inorganic material. The HBL can be an organic HBL comprising, for example, 2,9-Dimethyl-4,7-diphenyl-1,10-phenanthroline (BCP) p-bis (triphenylsityl)benzene (UGH2), 4,7-diphenyl-1,10-phenanthroline (BPhen), tris-(8-hydroxy quinoline) aluminum (Alq$_3$), 3,5'-N,N'-dicarbazole-benzene (mCP), $C_{60}$, or tris[3-(3-pyridyl)-mesityl]borane (3TPYMB).

Figure 4:
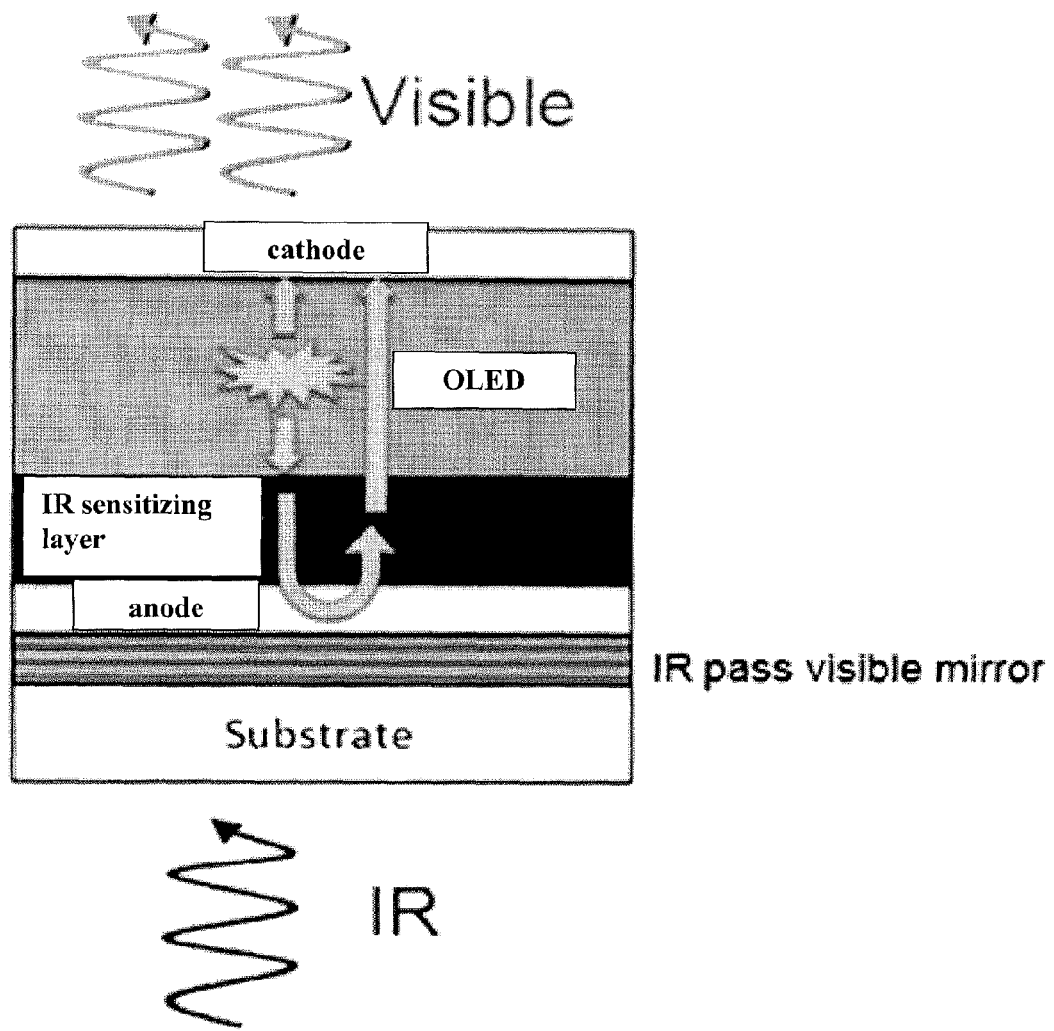
FIG. 4 is a schematic diagram of a transparent IR up-conversion device including an IR pass visible blocking layer to restrict emission of visible light to a single exit face of the stacked device according to an embodiment of the invention.
Figure 5:
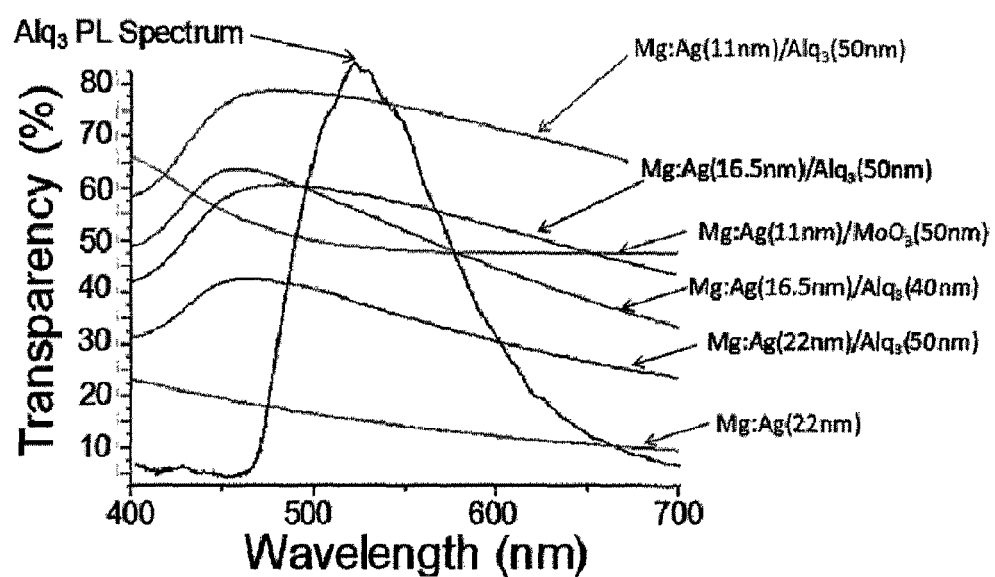
FIG. 5 shows visible spectra of cathodes having 10:1 Mg:Ag with and without antireflective layers indicating the antireflective layer for various compositions.

Transparent electrodes that can be employed at the IR entry surface, which is shown as the anode in FIG. 3 or FIG. 4, include, but are not limited to, indium tin oxide (ITO), indium zinc oxide (IZO), aluminum tin oxide (ATO), aluminum zinc oxide (AZO), carbon nanotube films, or silver nanowires. Transparent electrodes that can be employed at the visible exit surface, shown as the cathode in FIG. 3 or FIG. 4, include, but are not limited to, indium tin oxide (ITO), indium zinc oxide (IZO), aluminum tin oxide (ATO), aluminum zinc oxide (AZO), carbon nanotube, silver nanowire, or a Mg:Al layer. In one embodiment of the invention, a stacked 10:1 Mg:Ag layer with a thickness of less than 20 nm is used as a transparent electrode. In an embodiment of the invention, an anti-reflective layer can be situated on the exterior surface of the transparent electrode at the visible exit surface. For example, an Alq$_3$ layer can be an anti-reflective layer that allows good transparency when the Alq$_3$ layer is less than about 100 nm in thickness. Alternately, the antireflective layer can be a metal oxide, such as MoO$_3$, of about 50 nm or less in thickness. In an embodiment of the invention, the electrode at the visible light exit surface comprises a 10:1 Mg:Al layer of about 10 nm and an Alq$_3$ layer of 50 nm is situated upon the electrode. As shown in FIG. 5, different cathodes having different thicknesses of 10:1 Mg:Ag layers, with different thickness of anti-reflective layers, illustrate the advantage of the antireflective layer. As indicated in FIG. 5, the cathode can be thicker when the antireflective layer is present, and excellent transparency occurs for thin cathodes having antireflective layers up to about 50 nm in thickness.

An up-conversion device according to an embodiment of the invention is shown in FIG. 4, where, by including an IR pass visible blocking layer between the IR entry face and the LED layer, the device becomes visible light opaque at the IR entry face. The IR pass visible blocking layer absorbs and/or reflects visible light internally rather than allowing visible light loss through the IR entry face while permitting IR radiation to pass through the layer, as shown in FIG. 4. The electrode closest to the IR entry face must be IR transparent to a high degree, with at least 50% transmittance, and the electrode closest to the visible detection face must be visible light transparent to a high degree, with at least 50% transmittance over the wavelength range that visible light is emitted from the LED. In embodiments of the invention having no IR pass visible blocking layer, the device has at least 20% transmittance of light through the entire stack of layers. When the IR pass visible blocking layer has a reflective surface, an increase in the proportion of visible light directed to the light exiting face of the device is possible relative to a device having no layer or a non-reflective (light absorbing) IR pass visible blocking layer. The surfaces of the up-conversion device perpendicular to the stacked layers can be covered with an opaque coating or otherwise abutted to an opaque surface that is an absorbent and/or reflective surface such that visible light is not lost through the sides of the device. The position of the IR pass visible blocking layer, as shown in FIG. 4, can be situated as a layer between the substrate and anode. The layer can also be situated on the surface of the substrate opposite the anode, or, when both layers have the appropriate electronic properties to act as an interconnect layer or as an active layer in the device, the IR pass visible blocking layer can be situated between any layers of the device on the IR entry side of the LED employed in the device.

The IR pass visible blocking layer used in the up-conversion device, according to an embodiment of the invention, can employ a multi dielectric stack layer. The IR pass visible blocking layer comprises a stack of dielectric films with alternating films having different refractive indices, one of high refractive index and the other of a significantly lower refractive index. An exemplary IR pass visible blocking layer is a composite of 2 to 80 alternating layers of $Ta_2O_5$ (RI=2.1) and $SiO_2$ (RI=1.45) that are 10 to 100 nm in thickness.

Methods and Materials

Figure 6:
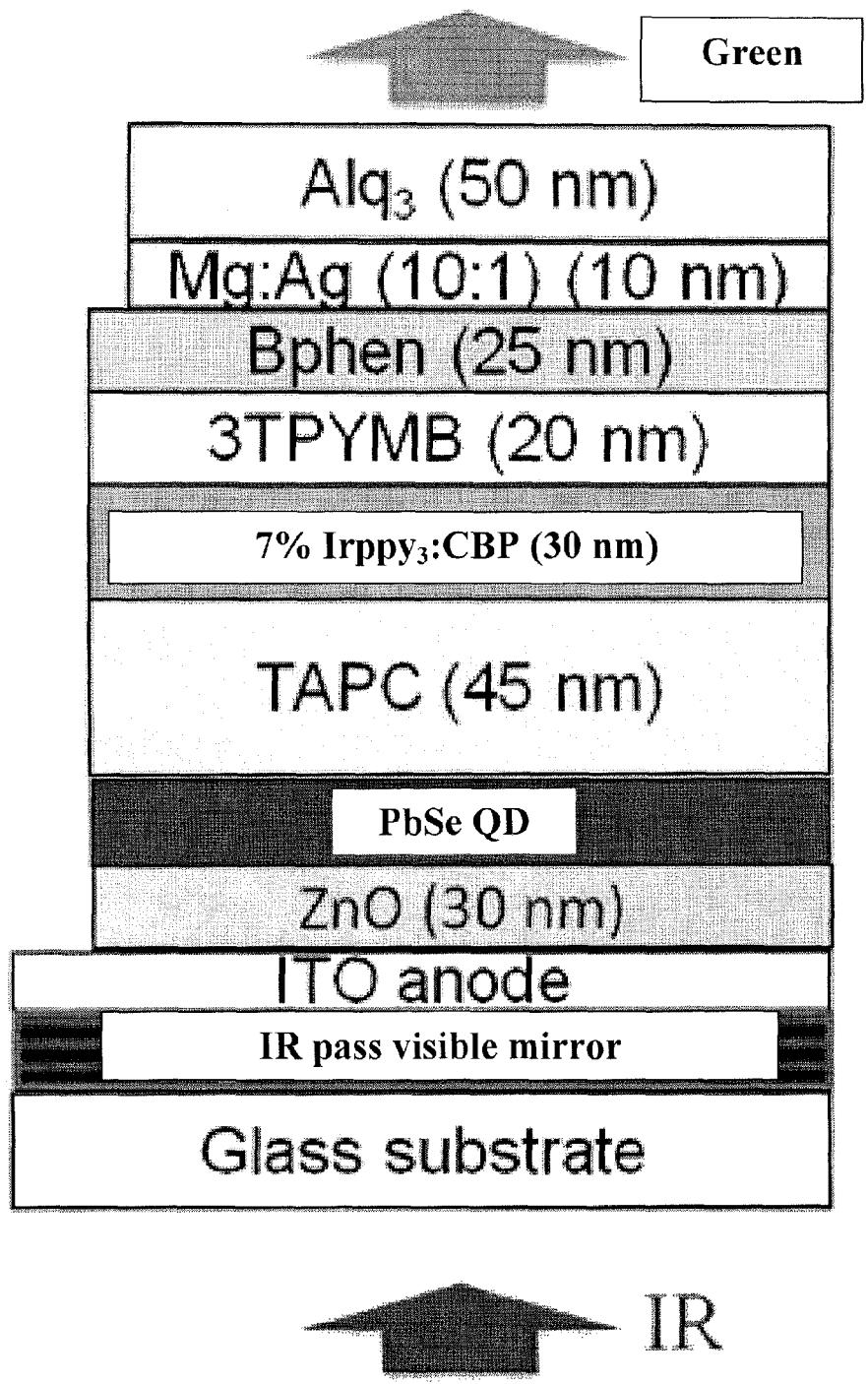
FIG. 6 is a schematic diagram of an exemplary transparent IR up-conversion device including an IR pass visible blocking layer, according to an embodiment of the invention.
Figure 7:
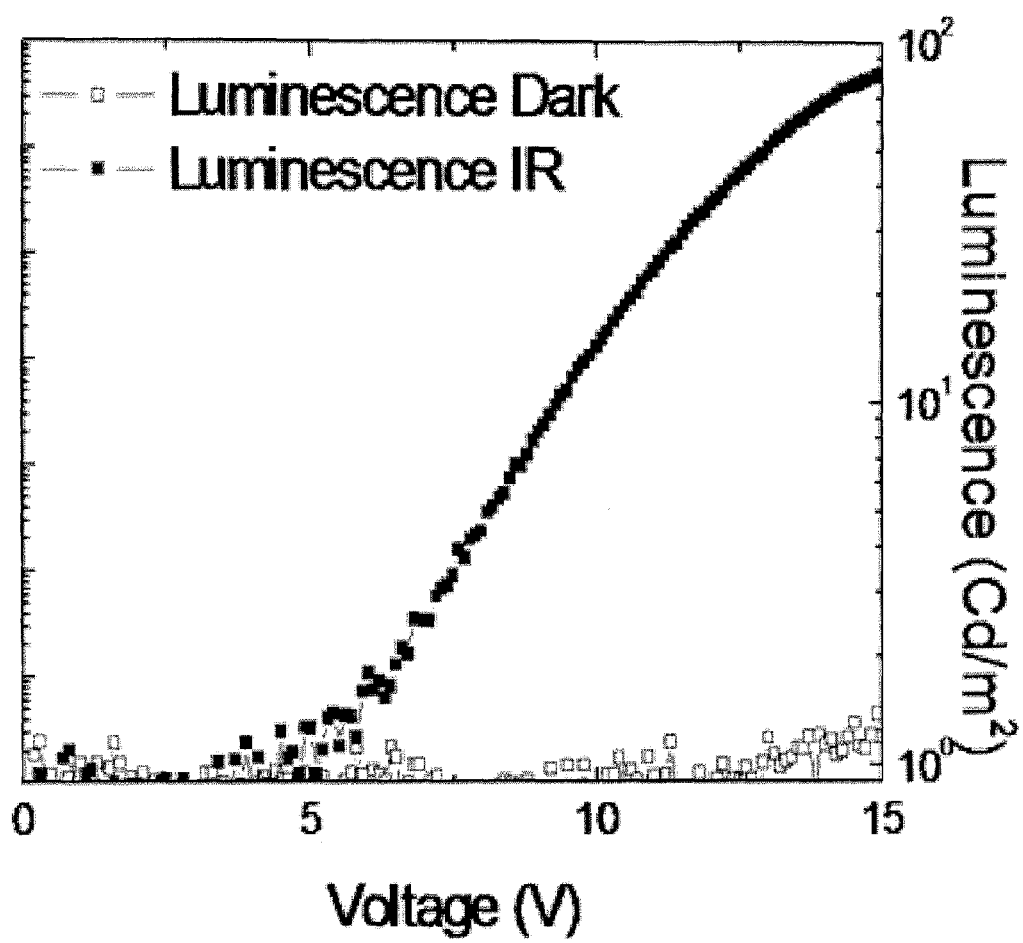
FIG. 7 is a plot of luminescence for different applied voltages for the IR up-conversion device of FIG. 6.

An exemplary up-conversion device according to an embodiment of the invention is shown in FIG. 6. The device has a glass substrate upon which resides an IR pass visible mirror of 14 alternating layers of $Ta_2O_5$ and $SiO_2$ which are about 70 nm thick on average and a transparent ITO anode of about 100 nm in thickness. Upon the anode is deposited a 30 nm film of ZnO as a HBL and a 100 nm thick layer of PBSe QDs as the IR sensitizing layer. The IR sensitizing layer is separated from a 30 nm thick 7% $Irppy_3$ CBP light emitting layer by a HTL of 45 nm of TAPC. The light emitting layer is separated, by a composite ETL of 20 nm of 3TPYMB and 25 nm of Bphen, from a 10 nm 10:1 Mg:Ag cathode, with a 50 nm $Alq_3$ anti-reflective layer on the opposite surface of the cathode. The up-conversion device of FIG. 6 displays almost no luminescence in the dark, but from a threshold of 5 V to 15 V undergoes about a 100 fold increase in luminescence, as shown in FIG. 7.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A transparent up-conversion device, comprising a stacked layer structure comprising:
   a transparent anode;
   at least one hole blocking layer;
   an IR sensitizing layer;
   at least one hole transport layer;
   a light emitting layer;
   at least one electron transport layer; and
   a transparent cathode,
   wherein the stacked layer structure has a visible light transmittance of at least 20 percent.

2. The up-conversion device of claim 1, wherein the stacked layer structure has a thickness of less than a micron.

3. The up-conversion device of claim 1, wherein the transparent anode or transparent cathode at a surface for entry of incident IR radiation to the stacked layer structure has an IR transmittance of at least 50% and wherein a surface for exit of visible light from the stacked layer structure has a visible light transmittance of at least 50%.

4. The up-conversion device of claim 1, wherein the transparent anode comprises Indium tin Oxide (ITO), Indium Zinc Oxide (IZO), Aluminum Tin Oxide (ATO), Aluminum Zinc Oxide (AZO), carbon nanotubes, or silver nanowires.

5. The up-conversion device of claim 1, wherein the at least one hole blocking layer comprises $TiO_2$, ZnO, BCP, Bphen, 3TPYMB, or UGH2.

6. The up-conversion device of claim 1, wherein the IR sensitizing layer comprises PbSe QDs, PbS QDs, PbSe film, PbS film, InAs film, InGaAs film, Si film, Ge film, GaAs film, perylene-3,4,9,10-tetracarboxylic-3,4,9,10-dianhydride (PTCDA), tin (II) phthalocyanine (SnPc), $SnPc:C_{60}$, aluminum phthalocyanine chloride (AlPcCl), $AlPcCl:C_{60}$, titanyl phthalocyanine (TiOPc), or $TiOPc:C_{60}$.

7. The up-conversion device of claim 1, wherein the at least one hole transport layer comprises 1,1-bis[(di-4-tolylamino)phenyl]cyclohexane (TAPC), N,N'-diphenyl-N,N' (2-naphthyl)-(1,1'-phenyl)-4,4'-diamine (NPB), or N,N'-diphenyl-N,N'-di(m-tolyl) benzidine (TPD).

8. The up-conversion device of claim 1, wherein the light emitting layer comprises tris-(2-phenylpyridine) iridium (Ir $(ppy)_3$), poly-[2-methoxy, 5-(2'-ethyl-hexyloxy) phenylene vinylene] (MEH-PPV), tris-(8-hydroxy quinoline) aluminum ($Alq_3$), or iridium (III) bis-[(4,6-di-fluorophenyl)-pyridinate-N,C2']picolinate (FIrpic).

9. The up-conversion device of claim 1, wherein the at least one electron transport layer comprises tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), or tris-(8-hydroxy quinoline) aluminum ($Alq_3$).

10. The up-conversion device of claim 1, wherein the transparent cathode comprises a 10:1 Mg:Ag layer with a thickness of less than 30 nm.

11. The up-conversion device of claim 1, further comprising an anti-reflective layer.

12. The up-conversion device of claim 11, wherein the anti-reflective layer comprises an $Alq_3$ layer having a thickness of less than 200 nm.

13. The up-conversion device of claim 1, further comprising an IR pass visible blocking layer.

14. The up-conversion device of claim 13, wherein the IR pass visible blocking layer comprises a plurality of alternating layers of materials having different refractive indexes.

15. The up-conversion device of claim 14, wherein the materials comprise $Ta_2O_5$ and $SiO_2$, wherein the plurality of alternating layers comprises 2 to 80 alternating layers of the materials, and wherein each of the alternating layers has a thickness of 10 to 100 nm.

16. The up-conversion device of claim 1, wherein the IR sensitizing layer comprises quantum dots.

17. The up-conversion device of claim 16, wherein the quantum dots comprise PbS quantum dots and/or PbSe quantum dots.

18. The up-conversion device of claim 1, wherein the IR sensitizing layer generates a charge carrier upon exposure to IR radiation, wherein the charge carrier is injected into the light emitting layer, wherein the charge carrier combines with a complementary charge carrier in the light emitting layer to generate visible light.

19. The up-conversion device of claim 11, wherein the anti-reflective layer is positioned adjacent the transparent cathode.

* * * * *